United States Patent [19]

Kondo et al.

[11] Patent Number: 5,011,530

[45] Date of Patent: Apr. 30, 1991

[54] METALLIZING COMPOSITION FOR USE WITH CERAMICS

[75] Inventors: Kazuo Kondo; Asao Morikawa, both of Aichi, Japan

[73] Assignee: NGK Spark Plug Co. Ltd., Japan

[21] Appl. No.: 289,339

[22] Filed: Dec. 23, 1988

[30] Foreign Application Priority Data

Dec. 24, 1987 [JP] Japan .................................. 62-325290

[51] Int. Cl.⁵ ......................... B05B 7/00; H01B 1/02; H01B 1/06
[52] U.S. Cl. ................... 106/1.13; 106/1.15; 106/1.26; 106/1.28; 252/512; 252/514; 252/518
[58] Field of Search .................. 252/512, 514, 518; 106/1.13, 1.12, 1.15, 1.22–1.25, 1.26, 1.28

[56] References Cited

U.S. PATENT DOCUMENTS

| | | | |
|---|---|---|---|
| 4,172,919 | 10/1979 | Mitchell | 252/512 |
| 4,552,691 | 11/1985 | Shoji et al. | 252/512 |
| 4,623,482 | 11/1986 | Kuo | 252/518 |
| 4,687,597 | 8/1987 | Siuta | 252/514 |
| 4,695,403 | 9/1987 | Nishimura et al. | 252/514 |

Primary Examiner—Josephine Barr

[57] ABSTRACT

Metallizing composition for use in ceramics, comprises 100 parts by weight of a CuO-Cu combination consisting of 30–70 wt % CuO and 70–30 wt % Cu, at least one inorganic component selected from not more than 10 parts by weight of $MnO_2$, not more than 7 parts by weight of Pt and not more than 5 parts by weight of Au, an organic binder and a solvent, wherein the Cu particles have a size in the range of 0.5–20 μm and consist of at least two classes of particles having different average sizes.

2 Claims, 1 Drawing Sheet

METALLIZING COMPOSITION FOR USE WITH CERAMICS

FIELD OF THE INVENTION

The present invention relates to a low-melting point and low-resistance electroconductive material that can be fired simultaneously with ceramics of low firing temperature the surface of which is to be metallized. More particularly, the present invention relates to a metallizing composition that is suitable for use in the fabrication of high-density multilayer wiring boards and packages.

BACKGROUND OF THE INVENTION

The demand for increasing the packing density of IC packages, multilayer wiring boards and other products of microelectronics is constantly growing and this has caused the need to develop commercially feasible low-dielectric constant ceramics and low-resistance conductors. Metals that have been commonly employed to make metallizing compositions are noble metals such as Au, Au-Pt, Ag-Pt and Ag-Pd, as well as high-melting point base metals such as W, Mo and Mo-Mn. Paste of noble metals such as Au, Au-Pt, Ag-Pt, and Ag-Pd have the advantage that it can be fired in air but, on the other hand, it suffers from the problem of high cost. The high-melting point metals such as W, Mo, and Mo-Mn have the advantage that they can be easily formed in multiple layers since they can be fired simultaneously with ceramics at about 1,600° C. or the temperature at which green ceramic sheets are sintered. Problems with these high melting point metals are low electroconductivity, potential hazard in operations that require firing in a reducing atmosphere, and the need to plate the conductor surface with Ni and other suitable metals to enable soldering. Under these circumstances, use has increased of ceramic wiring boards that employ Cu paste that is inexpensive and which offers high electroconductivity and good solderability.

A problem with this Cu paste is that in the manufacture of ceramic wiring boards, it is difficult to completely combust the organic matter in the paste without causing oxidation of Cu. If the Cu surface is oxidized, not only is the solderability of the paste impaired but its electroconductivity is also reduced. If care is taken to avoid the generation of CuO, the organic binder and other materials will remain without being completely burned away.

Another problem with the use of metallic Cu is that even if the step of removing the binder is separated from the step of Cu firing, the metallic Cu is oxidized to CuO in the step of binder removal and this causes an expansion in volume, leading to various problems such as separation from the substrate.

The present inventors previously proposed in Japanese Patent Application No. 62-254595 a metallizing composition having $MnO_2$, Pt and Au incorporated in a CuO-Cu system. This metallizing composition was suitable for the purpose of reducing the dielectric constant and expansion coefficient of a ceramic substrate made of crystallizable glass and significant improvement in hermeticity could be achieved when this composition was used in the package of a multi-layered substrate.

However, the present inventor later found that even with this metallizing composition, the size of Cu particles would be a very important factor for the production of a dense film of metallization. The present inventor, therefore, conducted intensive studies in this regard and found that the composition to be described herein is most preferable for the purpose of producing a dense film of metallization. Accordingly, it is an object of the present invention to provide an improvement of the invention proposed in Japanese Patent Application No. 62-254595.

SUMMARY OF THE INVENTION

The above-stated object of the present invention can be attained by a metallizing composition for use with ceramics which comprises 100 parts by weight of a CuO-Cu combination consisting of 30-70 wt % CuO and 70-30 wt % Cu, at least one inorganic component selected from among no more than 10 parts by weight of $MnO_2$, no more than 7 parts by weight of Pt and no more than 5 parts by weight of Au, an organic binder and a solvent, characterized in that the Cu particles have a size in the range of 0.5-20 $\mu$m and consist of at least two classes of particles having different average sizes.

DETAILED DESCRIPTION OF THE INVENTION

Figure 1A:
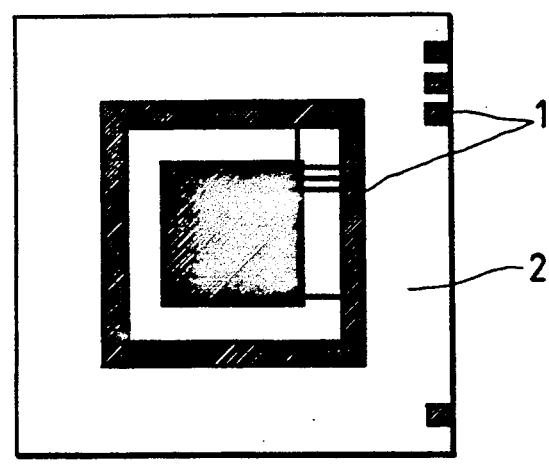
FIG. 1 includes a plan view (A) of a chip carrier package fabricated with the metallizing composition of the present invention and a cross section (B) of the package.

The term of "Cu particles consist of at least two classes of particles having different average sizes" means that the Cu powder is a mixture of two or more batches of powders having substantially different average sizes. That is, the Cu powder of the present invention does not show so-called normal distribution. For example, in a preferred embodiment, the Cu powder is made of two or more classes of particles selected from the group consisting of up to 20 parts by weight of particles having an average size of 0.8 $\mu$m, up to 50 parts by weight of particles having an average size of 3.2 $\mu$m, up to 50 parts by weight of particles having an average size of 15 $\mu$m.

The CuO and Cu in the metallizing composition of the present invention are rendered conductive by heating with a ceramic green sheet in either a reduced or an inert atmosphere. The proportions of CuO and Cu are limited to be within the range of 30 to 70 wt % CuO and 70-30 wt % Cu in order to cancel out the loss of the organic resin component in the calcination step by the volume expansion due to oxidation of Cu in the same step, thereby creating a state in which the CuO particles are densely packed. This is effective for the purpose of minimizing the volume contraction of CuO that will occur in the subsequent step of reduction. If the CuO to Cu ratio is outside the range set forth above, the intended results will not be attained; for instance, if the CuO/Cu ratio is 80:20, hermeticity is not attainable, and if the CuO/Cu ratio is 20:80, a volume expansion will occur on account of oxidation in the degreasing step and delamination of a metallized layer can take place.

The content of $MnO_2$ in the composition of the present invention is limited to be no more than 10 parts by weight per 100 parts by weight of the sum of CuO and Cu. Manganese dioxide ($MnO_2$), when reduced, turns to $Mn_2O_3$, MnO or Mn and increases the ability of copper to wet the ceramics or crystallizable glass in the substrate. If the content of $MnO_2$ is over 10 parts by weight, the sinterability of copper particles is impaired, causing leakage damage or increased resistance.

Platinum and gold cooperate with Cu and CuO to serve to ensure the necessary electrical conductivity. In addition to this advantage, Pt and Au, which sparingly undergo oxidation or reduction at elevated temperatures, contribute to maintaining a near constant overall volume of the conductor. If the content of Pt is 7 parts or more by weight, the conductor will have an increased resistance which is somewhat unfavorable for the purpose of providing interconnection through a plurality of holes extending through multiple layers.

The finer the particles of Cu in the CuO/Cu mixture, the more dense the finally obtained metallized layer will be. However, fine Cu particles are very easily oxidized in the calcination step and if the resulting volume expansion exceeds the reduction in volume due to the loss of the resin, the metallized layer will separate from the ceramic substrate. If corase particles are used, they will not be packed to a desired density, nor will they be oxidized to the same extent as the fine particles are. Therefore, the use of coarse particles will reduce the chance of the metallized layer of separating from the ceramic substrate but, on the other hand, the metallized layer is not as dense as it should be because of the low packing density of the particles.

On the basis of this understanding, the present inventor found the necessity of selecting Cu particles having a size in the range of 0.5-20 $\mu$m. It was also found that a higher packing density could be attained by using two or more classes of Cu particles having different average sizes. A typical choice of Cu powders is as follows: no more than 20 parts by weight of a powder having an average particle size of 0.8 $\mu$m; no more than 50 parts by weight of a powder having an average particle size of 3.2 $\mu$m, and no more than 50 parts by weight of a powder having an average particle size of 15 $\mu$m. If two or more of these powders are used in combination, the fine and coarse particles will exhibit their advantages while cancelling out each other's defects; the resulting metallized layer is dense, adheres firmly to the ceramic substrate and will not experience any separation from the latter.

Illustrative values of the proportions of CuO and Cu in admixtures are shown below in Table 1.

TABLE 1

| | CuO/Cu Mixing Ratio (in Parts by Weight) | | | |
|---|---|---|---|---|
| | CuO powder | CU Powder | | |
| No. | (0.8 $\mu$m) | 0.8 ($\mu$m) | 3.2 ($\mu$m) | 15 ($\mu$m) |
| 1 | 40 | 10 | 50 | 0 |
| 2 | 50 | 20 | 30 | 0 |
| 3 | 40 | 10 | 20 | 30 |
| 4 | 40 | 5 | 15 | 40 |

The organic binder and the solvent according to the present invention are not specifically limited. The materials used in the field of a ceramic industry may be used. An amount of the binder is used in an amount of 3 to 10 parts by weight based on an amount of a mixture of CuO and Cu as 100, whereas an amount of the solvent may be varied, for example, to be adjusted to appropriate viscosity for silk printing.

The following example is provided for the purpose of describing an outline of a process for fabricating a product that utilizes the metallizing composition of the present invention. It should, however, be noted that the present invention is by no means limited to this particular example. Unless otherwise indicated, all parts, percents and ratios are by weight.

EXAMPLES 1 TO 4

(1) As in the case of sample No. 5 prepared in the Examples described in the specification of the invention entitled "Crystallizable glass body" filed the assignee of subject application under JP-A-59-92943 (the term "JP-A" as used hereinafter means on unexamined published Japanese patent application), ZnO, $MgCO_3$, Al$(OH)_3$, $SiO_2$, $H_3BO_3$ and $H_3PO_4$ were measured in such amounts that they would provide a composition consisting of 4% ZnO, 13% MgO, 23% $Al_2O_3$, 58% $SiO_2$, 1% $B_2O_3$ and 1% $P_2O_5$. These ingredients were mixed in a mixing and griding machine, melted at 1,450° C. in an alumina crucible, and quenched in water to form a glassy material. This material was ground in an alumina ball mill to produce a frit consisting of glass particles having an average particle size of 2 $\mu$m.

(2) An organic binder, ethyl cellulose, and a solvent, $\alpha$-terpineol, were mixed with the frit to form a slurry, which was shaped into a green sheet of 0.6 mm thickness by doctor blading which is a raw material of a crystallized grass body.

(3) A CuO powder, a Cu powder (a mixture of different sized particles), a $MnO_2$ powder and a Pt powder or a Au powder, each of which has the average particle sizes as shown in Table 2, were mixed in the proportions shown in Table 1 below. The resulting formulations were mixed with an organic binder (ethyl cellulose) and a solvent (butyl carbitol) and kneaded in an agate mortar to form samples of metallized paste having the compositions shown in Table 2 according to the present invention.

TABLE 2

| Recipe of Metallizing Composition (Parts by weight) | | | | | | | |
|---|---|---|---|---|---|---|---|
| Example Nos. | CuO (1 $\mu$m) | Cu | | | $MnO_2$ | Pt | Au (1–3 $\mu$m) |
| | | 0.8 $\mu$m | 3.2 $\mu$m | 15 $\mu$m | | | |
| 1 | 60 | 20 | 20 | 0 | 2 | powder (0.5 $\mu$m) 3 | 2 |
| 2 | 50 | 20 | 30 | 0 | 2 | metal resinate 3 | 2 |
| 3 | 40 | 5 | 10 | 45 | 2 | metal resinate 3 | 2 |
| 4 | 40 | 20 | 20 | 20 | 3 | metal resinate 4 | 2 |

Note:
Figures with the suffix "$\mu$m" denote the average particle size of the powder.

(4) A circuit pattern consisting of 40 conductor strips (40 mm long × 0.5 mm wide × 20 $\mu$m thick) spaced at a distance of 1 mm was formed by screen-printing the metallizing paste prepared in (3) on the surface of the green sheet made of the crystallizable glass prepared in (2).

(5) Through-holes (300 $\mu$m in diameter) were formed in 200 selected locations of the striped circuit pattern and a similar circuit pattern of strips was formed by screen-printing the metallizing paste prepared in (3) on positions where the latter strips would cross over the through-holes at right angles with respect to the strips in the first pattern of the metallizing paste, with the through-holes being filled with the metallizing composition.

(6) Six layers of the patterned green sheet were superposed on a single unpatterned base sheet that was much thicker than the individual green sheets, and the seven layers were thermocompressed to form a unitary assembly which was subsequently cut into squares measuring 50 mm×50 mm.

(7) The resulting cut pieces of the assembly were heated in an air atmosphere up to 750° C. over a period of 8 hours and held at that temperature for 0.2 to 1.0 hour.

(8) The pieces were then transferred into a hydrogen atmosphere, in which they were heated from ambient or room temperature to 350° C. at a rate of 0.5° C./min, hold at that temperature for 0.5 to 1.5 hours, and fired at 950° C. in a hydrogen or inert atmosphere.

Figure 1B:
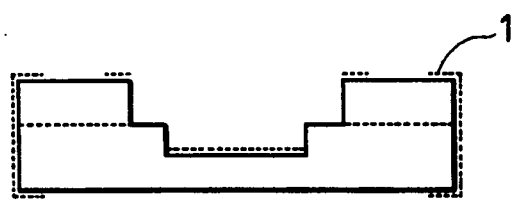

The structure of a chip carrier fabricated using the metallizing composition of the present invention is shown in FIG. 1. In the chip carrier package shown in FIG. 1, numeral 1 denotes the metallized layer formed of the metallizing composition of the present invention, and numeral 2 signifies a substrate made of a ceramic body such as crystallizable glass which is capable of being fired at low temperatures.

Multilayered boards were fabricating using the metallizing composition of the present invention and subjected to both a hermeticity test and an environmental test.

Hermeticity measurements were conducted with a He leak detector. All of the samples under test showed values of not more than $1.0\times10^{-8}$ Std, cc/sec, nor did they experience any deterioration in the environmental test. The environmental test conditions were as follows:

| (1) temperature cycle | (−65 to 200° C.) | 10 cycles |
|---|---|---|
| (2) thermal shock | (0 to 100° C.) | 15 cycles |
| | (−55 to 125° C.) | 15 cycles |
| | (−65 to 150° C.) | 100 cycles |

Similar tests were conducted on multilayered boards employing as the substrate, the crystallized glass bodies, described in JP-A-59-92943, JP-A-59-83957, JP-A-59-137341, and JP-A-59-129441. The metallizing composition of the present invention also proved to be effective with these substrates.

COMPARATIVE EXAMPLE

A comparative test was conducted on samples containing variously mixed CuO and Cu powders, with the latter being composed of particles of a single-valued average size rather than a mixture of particles having different sizes. The results were as shown in Table 3. All samples except one were poor in hermeticity and half of them experienced delamination of the metallized layer.

TABLE 3

| CuO/Cu (particle size) | Hermeticity | Delamination |
|---|---|---|
| CuO/Cu (0.8 μm) | | |
| 90/10 | N.G. | absent |
| 70/30 | N.G. | present |
| 50/50 | N.G. | " |
| 30/70 | O.K. | " |
| CuO/Cu (15 μm) | | |
| 90/10 | N.G. | absent |
| 70/30 | N.G. | " |
| 50/50 | N.G. | " |
| 30/70 | N.G. | present |

It was therefore clear the comparative samples were unable to satisfy both requirements for resistance to delamination and hermeticity.

The CuO/Cu based metallizing composition of the present invention has a low electrical resistance and is suitable for the purpose of reducing the dielectric constant and expansion coefficient of a ceramic substrate made of crystallizable glass. The effectiveness of this composition is remarkable since the Cu powder in it consists of a mixture of two or more classes of particles having different average sizes. One application of this composition is in the package of a multilayered substrate and a metallized layer having a very high degree of hermeticity can be obtained by using this composition.

While the invention has been described in detail and with reference to specific embodiments thereof, it will be apparent to one skilled in the art that various changes and modifications can be made therein without departing from the spirit and scope thereof.

What is claimed is:

1. A metallizing composition for use in ceramics which comprises 100 parts by weight of a CuO-Cu combination consisting of 30-70 wt % CuO and 70-30 wt % Cu, at least one inorganic component selected from among no more than 10 parts by weight of $MnO_2$ based on 100 parts by weight of the CuO-Cu combination, no more than 7 parts by weight of Pt based on 100 parts by weight of the CuO-Cu combination and no more than 5 parts by weight of Au based on 100 parts by weight of the CuO-Cu combination, an organic binder and a solvent, wherein the Cu particles have a size in the range of 0.5–20 μm and consist of at least two classes of particles having different average sizes, selected from a group having an average size of 0.8 μm, a group having an average size of 3.2 μm, and a group having an average size of 15 μm.

2. A metallizing composition according to claim 1 wherein said Cu powder is made of two or more classes of particles selected from the group consisting of up to 20 parts by weight of particles having an average size of 0.8 μm, up to 50 parts by weight of particles having an average size of 3.2 μm, and up to 50 parts by weight of particles having an average size of 15 μm.

* * * * *